United States Patent
Dalton et al.

(10) Patent No.: US 6,589,887 B1
(45) Date of Patent: Jul. 8, 2003

(54) FORMING METAL-DERIVED LAYERS BY SIMULTANEOUS DEPOSITION AND EVAPORATION OF METAL

(75) Inventors: Jeremie Dalton, San Jose, CA (US); Ronald A. Powell, San Carlos, CA (US); Sridhar K. Kailasam, Fremont, CA (US); Sasangan Ramanathan, San Ramon, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/975,612

(22) Filed: Oct. 11, 2001

(51) Int. Cl.⁷ .................... H01L 21/4763; H01L 21/31
(52) U.S. Cl. .................... 438/765; 438/627; 438/643; 438/653; 438/660; 438/679; 438/680; 438/775
(58) Field of Search .................... 438/627, 641, 438/653, 674, 679, 688, 765, 788, 798

(56) References Cited

U.S. PATENT DOCUMENTS 4,058,430 A * 11/1977 Suntola et al.
5,378,506 A * 1/1995 Imai et al.
6,200,893 B1 * 3/2001 Sneh
6,203,613 B1 * 3/2001 Gates et al.
6,391,785 B1 * 5/2002 Satta et al.

* cited by examiner

*Primary Examiner*—Ha Tran Nguyen
(74) *Attorney, Agent, or Firm*—Beyer Weaver & Thomas, LLP

(57) ABSTRACT

The present invention pertains to methods for forming metal-derived layers on substrates. Preferred methods apply to integrated circuit fabrication. In particular, selective methods may be used to form diffusion barriers on partially fabricated integrated circuits. In one preferred method, a wafer is heated and exposed to a metal vapor. Under specific conditions, the metal vapor reacts with dielectric surfaces to form a diffusion barrier, but does not react with metal surfaces. Thus, methods of the invention form diffusion barriers that selectively protect dielectric surfaces but leave metal surfaces free of diffusion barrier.

25 Claims, 8 Drawing Sheets

FORMING METAL-DERIVED LAYERS BY SIMULTANEOUS DEPOSITION AND EVAPORATION OF METAL

FIELD OF THE INVENTION

The present invention pertains to methods for forming metal-derived layers on substrates. Particular methods apply to integrated circuit fabrication. Even more specifically, the invention pertains to selective methods for forming diffusion barriers on partially fabricated integrated circuits.

BACKGROUND OF THE INVENTION

Modern manufacturing in the electronics industry relies heavily on thin film layers of various materials, particularly for integrated circuit (IC) fabrication. Some of these include diffusion barrier layers, anti-reflective layers, etch stop layers, dielectric layers, and the like. Many of these layers are made of metal or metal-derived materials.

Recently, copper is finding increasing use in IC fabrication for conductive pathways due to its excellent conductivity and electromigration resistance. However, copper readily diffuses into surrounding dielectric materials and degrades their insulating electrical properties. Hence, diffusion barriers are needed to protect adjoining dielectric materials from copper migration. Commonly, both conductive and nonconductive diffusion barriers are used in conjunction to encapsulate the copper routes.

Most notable among IC fabrication processes that use diffusion barriers in conjunction with copper inlaid conductive routes is Damascene processing. Damascene processing is often a preferred method because it requires fewer processing steps than conventional methods and offers higher yields. It is also particularly well suited to metals such as copper, which cannot readily be patterned by plasma etching. During a Damascene process in IC fabrication, a pre-formed dielectric layer (for example silicon dioxide) is etched in order to form line paths (trenches and vias). These surface features will ultimately be filled with copper inlay to form conductive routes. As mentioned previously, copper can readily migrate into the adjoining dielectric regions under the influence of thermal and electrical gradients. Hence, before copper can be deposited, the dielectrics must first be protected with a diffusion barrier. Typically an electrically conductive barrier layer is used in the via and trench features. Suitable materials for electrically conductive diffusion barriers include tantalum, tantalum nitride, tungsten, titanium, titanium tungsten, and titanium nitride, to name a few.

Typically, diffusion barriers are formed by deposition methods such as physical vapor deposition (PVD) or chemical vapor deposition (CVD). Using these methods, a conductive diffusion barrier is layered over the surface of a wafer (including the vias and trenches) and a copper layer, to serve as seed for the next step, is deposited thereon. The wafer is transferred to an electrochemical bath for an overcoat of copper that will also fill the vias and trenches. Subsequently, chemical-mechanical planarization techniques are applied to remove the copper overcoat, leaving copper in the vias and trenches alone. After the copper inlay is in place, a non-conductive diffusion barrier (e.g. silicon nitride or silicon carbide) is deposited over the field surface of the wafer to encapsulate the copper routes. In subsequent processing, when a newly laid dielectric layer is etched to form another series of via and trench features, the non-conductive diffusion barrier is etched through to reveal the underlying copper conductive routes. Another conductive diffusion barrier is deposited, followed by another layer of copper inlay, and another non-conductive diffusion barrier. This process is repeated forming layers of electrically connected, but encapsulated, copper conductive routes. Thus, in the final structure there is a conductive diffusion barrier between adjoining copper conductive routes.

Although diffusion barriers can be broadly categorized as conductive and nonconductive, the materials (mentioned above) used for conductive diffusion barriers are often ten to one hundred times less electrically conductive than the copper routes that they encapsulate. Such diffusion barriers are sufficiently conductive for conventional circuitry, however, with the continuing need for faster signal propagation and reliable microchip circuitry, the electrical resistance of conventional diffusion barriers made of the materials mentioned above is problematic.

What are therefore needed are selective methods for forming metal-derived layers on substrates. More specifically, methods are needed for forming metal-derived layers on integrated circuit structures. Even more specifically, selective methods are needed for forming barrier layers on integrated circuit structures, methods in which the diffusion barrier is formed only on dielectric surfaces and not on metal surfaces. In this way, process sequences are shortened and the resistance between inlayed metal conductive routes is reduced.

SUMMARY OF THE INVENTION

The present invention pertains to selective methods for forming metal-derived layers on substrates. Preferred methods apply to integrated circuit fabrication. In particular, selective methods of this invention may form diffusion barriers on partially fabricated integrated circuits. In one preferred method, a wafer is heated and exposed to a metal vapor. Henceforth, a reference to metal vapor implies neutral metal atoms, metal ions, or combinations of the two. Under specific conditions, the metal vapor chemically reacts with dielectric surfaces to form a diffusion barrier, but does not react with metal surfaces. Thus, methods of the invention form diffusion barriers that selectively protect dielectric surfaces but leave metal surfaces free of diffusion barrier.

Thus, one aspect of the invention pertains to a method for forming a metal-derived layer on at least a portion of a substrate. Such methods may be characterized by the following sequence: heating the substrate; and exposing the substrate to a metal vapor under a set of conditions in which the metal vapor chemically reacts with at least a portion of the surface of the substrate to form the metal-derived layer thereon, the metal-derived layer being non-volatile under the set of conditions. Preferably the set of conditions includes a flux of metal vapor and a substrate temperature such that the evaporation rate of metal from the substrate is equal to or greater than the deposition rate of the metal on the wafer substrate. Hence, there is no net build-up of metal on the wafer substrate, but accompanying reactions yield a metal-derived layer selectively on at least a portion of the wafer substrate.

In some preferred methods of the invention, the substrate is a partially fabricated integrated circuit and the metal-derived layer is made of at least one of a metal-oxide, a metal-carbide, a metal-nitride, a metal-silicide, a metal halide, and combinations thereof. For methods of the invention that pertain to integrated circuit fabrication, the substrate temperature is preferably between about 50 and 1000° C., more preferably between about 200 and 400° C. For IC fabrication, preferably metal vapors are formed by a physical vapor deposition (PVD) technique such as evaporation, sputtering, etc. In a particularly preferred embodiment, the PVD technique is magnetron sputtering. As would be understood by one skilled in the art, single metals or combinations of metals can be used to form metal vapors, especially using the above mentioned PVD techniques. Preferably the metal vapor of the invention includes at least one of magnesium, aluminum, zinc, cadmium, calcium, tin, and strontium.

Even more specific to integrated circuit fabrication, another aspect of the invention pertains to a method for selectively forming a diffusion barrier on a wafer substrate having a plurality of dielectric surfaces and a plurality of metal interconnect surfaces. Such methods may be characterized by the following sequence: heating the wafer substrate, and exposing the wafer substrate to a metal vapor under a set of conditions in which the metal vapor chemically reacts with the plurality of dielectric surfaces to form a non-volatile barrier material thereon, and the metal vapor does not react with the plurality of metal interconnect surfaces. Preferably the set of conditions includes a flux of metal vapor and a wafer substrate temperature such that the evaporation rate of deposited metal from the substrate is equal to or greater than the deposition rate of the metal vapor on the wafer substrate. This aspect of the invention pertains particularly to Damascene processing, preferably with copper interconnects.

Dielectric surfaces to which the invention is applicable preferably include at least one of silicon dioxide, silicon nitride, silicon oxynitride, fluorinated silica glass, CORAL™ from Novellus Systems, Inc. of San Jose, Calif., Black Diamond™ from Applied Materials, Inc. of San Jose, Calif., SiLK™ from Dow Corning, Inc. of Midland, Mich., and Nanoglass™ of Nanopore, Inc. of Albuquerque, N.Mex. Preferably the diffusion barriers formed on integrated circuit substrates are made of the non-volatile barrier material that is between about 10 and 200 Å thick.

In particularly preferred methods, the metal vapor is produced in an energized plasma, and the metal is magnesium. In these methods, the wafer substrate temperature is between about 200 and 500° C., more preferably about 400° C. The non-volatile barrier material formed in these methods will include at least one of magnesium oxide, magnesium silicon oxide, magnesium nitride, and magnesium silicate. Preferably, these magnesium-based non-volatile barrier materials formed are between about 10 and 100 Å thick.

These and other features and advantages of the present invention will be described in more detail below with reference to the associated drawings.

DETAILED DESCRIPTION OF PREFERRED EMBODIMENTS

Figure 1A:
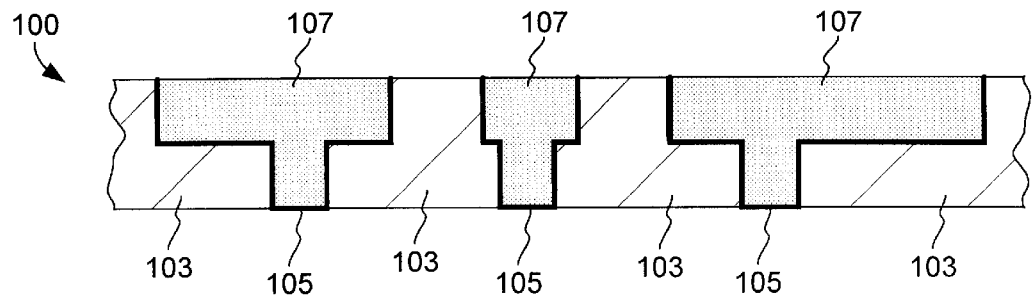
FIGS. 1A–G show cross sectional depictions of a copper dual-Damascene fabrication process in accordance with the present invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As mentioned, the invention pertains to methods for forming metal-derived layers on substrates. Some preferred methods apply to integrated circuit fabrication; however, the invention is not so limited. More generically, one aspect of the invention is a method for forming a metal-derived layer on at least a portion of a substrate. Such methods may be characterized by the following sequence: heating the substrate, and exposing the substrate to a metal vapor under a set of conditions in which the metal vapor chemically reacts with at least a portion of the surface of the substrate to form the metal-derived layer thereon. Preferably the set of conditions includes a flux of metal vapor and a wafer substrate such that the evaporation rate of metal from the substrate is equal to or greater than the deposition rate of the metal on the wafer substrate. Also preferably, the metal-derived layer will be non-volatile under the set of conditions.

Methods of the invention take advantage of the reactivity of at least some portions of substrate surfaces with metal-vapors. The metal-derived layers of the invention are not merely deposited on the substrate surfaces, but rather the metal vapor reacts with the substrate surface to form the metal-derived layer on the surface of the substrate. Thus, in this application, the term "substrate" is meant to mean any work piece that has at least some surface that will react with metal-vapors to form metal-derived layers of the invention. The substrate may be of various shapes, sizes, and materials. In addition to semiconductor wafers, other substrates that may take advantage of this invention include various articles such as optical and/or magnetic data storage devices, passive and/or active optical components, protective coatings, and the like. Metals used to form the metal vapor include at least one of magnesium, aluminum, zinc, cadmium, calcium, tin and strontium. Preferably the metal vapor is produced using a physical vapor deposition method. Physical vaporization techniques such as evaporation, sputtering, ion beams, and molecular beams can be used to provide the metal flux of the invention. In a particularly preferred embodiment, magnetron sputtering is used to produce the metal vapor due to the maturity of the technology, relatively low cost, and purity of metal flux, among other reasons.

Some preferred methods of the invention are used to form metal-derived layers in the context of integrated circuit fabrication. In this application, the terms "wafer" and "wafer substrate", each referring to a silicon wafer, will be used interchangeably with "partially fabricated integrated circuit." One skilled in the art would understand that the term "partially fabricated integrated circuit" could refer to a silicon wafer during any of many stages of integrated circuit fabrication thereon.

The invention finds use in many stages of integrated circuit fabrication. For example, metal-derived layers of the invention can be used as barrier layers, etch stop layers, gate dielectrics, anti-reflective coatings, capacitor dielectrics, contact metallization, and thin film resistors. Since these applications span front- and back-end processes in integrated circuit fabrication, the wafer temperature for methods of the invention is preferably between about 50 and 1000° C., more preferably between about 200 and 500° C. Suitable metal derived layers of the invention on integrated circuitry include at least one of a metal-oxide, a metal-carbide, a metal-nitride, a metal-silicide, a metal halide, and combinations thereof. There are many reactors that will accommodate methods of the invention. For example, the INOVA™ tool, available from Novellus Systems, Inc. of San Jose, Calif. and the Endura™ tool, available from Applied Materials, Inc. of Santa Clara, Calif. can be used to practice the invention.

Particular methods of the invention are selective for forming diffusion barriers on partially fabricated integrated circuits. Preferably, a wafer is heated and exposed to a metal vapor. Under specific conditions, the metal vapor reacts with dielectric surfaces to form a diffusion barrier, but does not react with metal surfaces. Thus, such methods of the invention form diffusion barriers that selectively protect dielectric surfaces but leave metal surfaces free of diffusion barrier. In order to more fully frame the context of such methods, a brief description of a dual Damascene process flow for forming copper interconnects on a partially fabricated integrated circuit is described below.

Presented in FIGS. 1A–1G, is a cross sectional depiction of a dual Damascene fabrication process in accordance with this invention. Referring to FIG. 1A, an example of a typical substrate, 100, used for dual damascene fabrication is illustrated. Substrate 100 includes a pre-formed dielectric layer 103 (such as silicon dioxide or low k materials) with etched line paths (trenches and vias) in which a diffusion barrier 105 has been deposited followed by inlaying with copper conductive routes 107. Since copper readily diffuses into the adjoining dielectric under thermal and/or electrical gradients, the adjoining dielectrics and the underlying silicon devices must be protected from copper atoms and copper ions. As mentioned, electrically conductive materials for diffusion barrier 105 commonly include tantalum, tantalum nitride, tungsten, titanium, titanium tungsten, titanium nitride, and the like. In a typical process, barrier 105 is formed by a physical vapor deposition (PVD) process such as sputtering or a chemical a vapor deposition (CVD) process. The resultant partially fabricated integrated circuit 100 is a representative substrate for subsequent Damascene processing, as depicted in FIGS. 1B–1G.

Figure 1B:
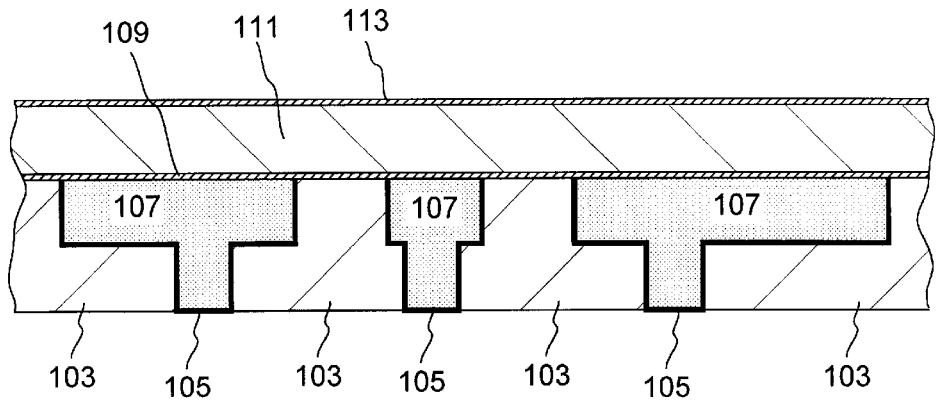

As depicted in FIG. 1B, a non-conductive (e.g. silicon nitride) diffusion barrier/etch stop 109 is deposited to encapsulate conductive routes 107. Next, a first dielectric layer, 111, of a dual damascene dielectric structure is deposited on diffusion barrier/etch stop layer 109. This is followed by deposition of an etch stop layer 113 (typically composed of silicon nitride or silicon carbide) on the first dielectric layer 111.

Figure 1C:
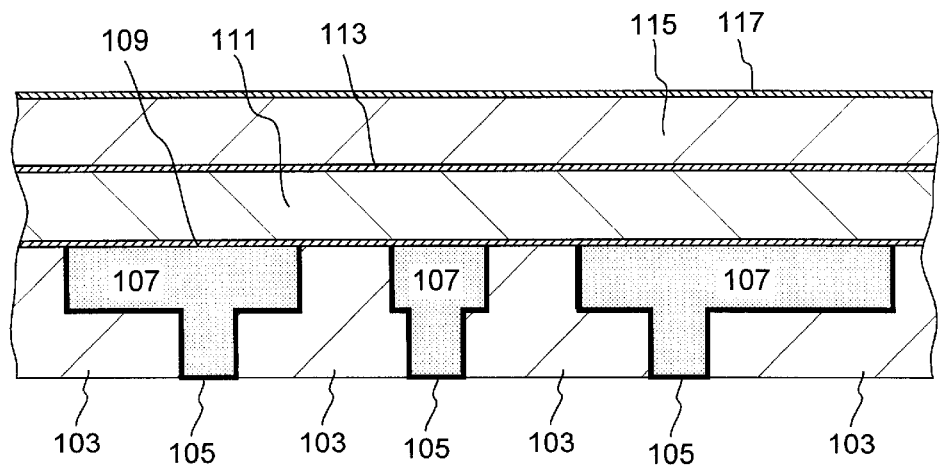

The process follows, as depicted in FIG. 1C, where a second dielectric layer 115 of the dual damascene dielectric structure is deposited in a similar manner to the first dielectric layer 111, onto etch stop layer 113. Deposition of an antireflective layer 117, typically a silicon oxynitride, follows.

Figure 1D:
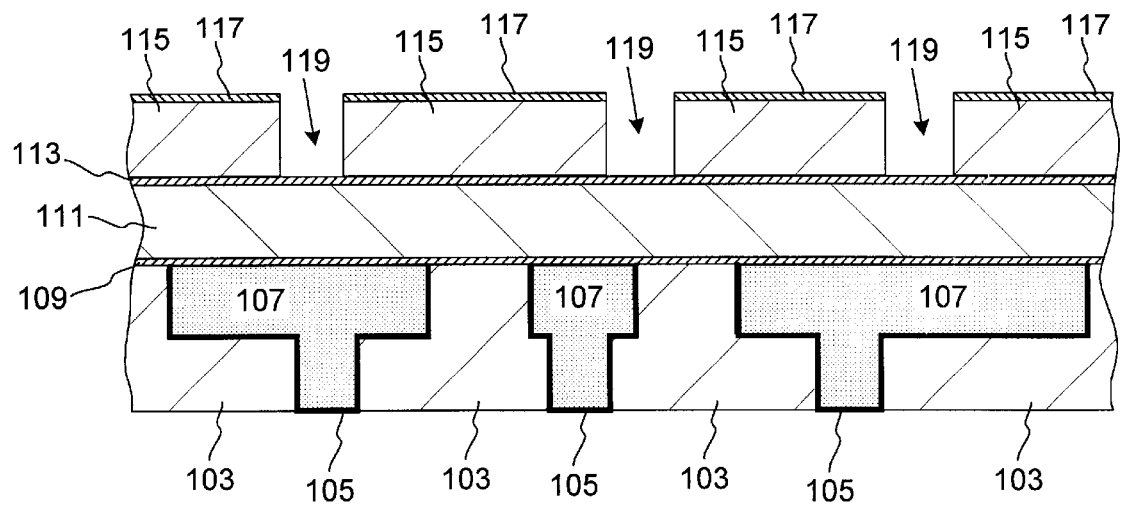
Figure 1E:
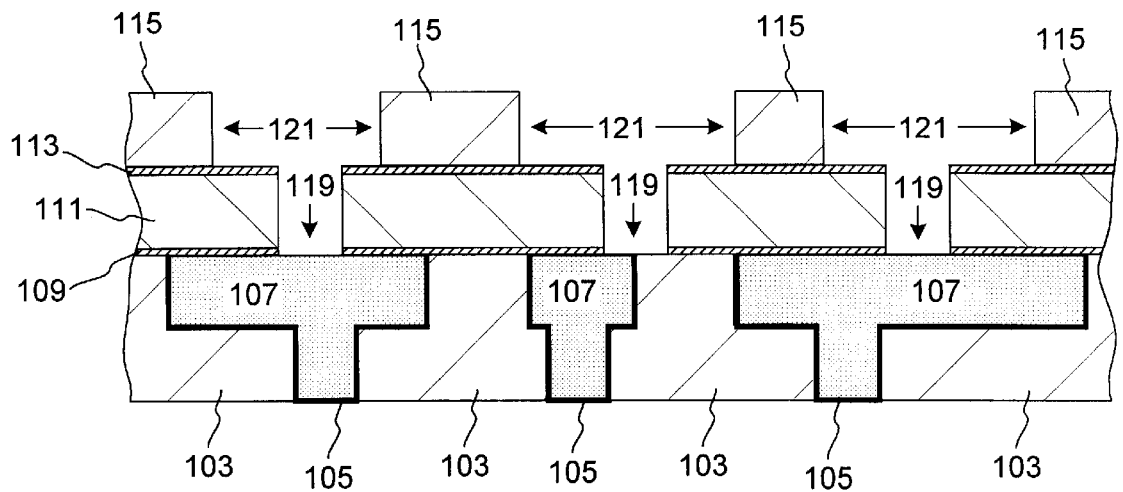

The dual Damascene process continues, as depicted in FIGS. 1D–1E, with etching of vias and trenches in the first and second dielectric layers. First, vias 119 are etched through antireflective layer 117, as well as the first and second dielectric layers 111 and 115. Standard lithography techniques are used to etch a pattern of these vias. The etching of vias 119 is controlled such that diffusion barrier/etch stop layer 109 is not penetrated. As depicted in FIG. 1E, in a subsequent lithography process, trenches 121 are etched in the second dielectric layer 115.

Conventionally, using PVD or CVD, a conformal diffusion barrier (made of the conductive materials mentioned above) would be deposited on the wafer substrate as depicted in FIG. 1E. As mentioned, this diffusion barrier would cover the newly exposed portions of copper routes 107 at the via bottoms, providing an undesirable increase in resistance of the conductive routes due to the barrier layer between the eventual stacked copper layers. The current invention is not constrained by the use of conductive barrier materials, since barrier material is selectively formed on the dielectric surfaces and not on the metal conductive route surfaces. Methods of the invention for forming diffusion barriers on wafers take advantage of the differential material properties of metals (e.g. copper) and dielectrics (or other material surfaces that can react with metal-vapors to form derivatives thereof).

Referring again to FIG. 1E, vias 119 and trenches 121 have exposed regions of dielectric (and silicon nitride barriers 113 and 109) as well as exposed copper routes 107 (at the via bottoms). Methods of the invention selectively form diffusion barrier by reaction with dielectric materials but not with metals. Preferably the dielectric surfaces include at least one of silicon dioxide, silicon oxynitride, silicon nitride, fluorinated silica glass, CORAL™, Black Diamond™, SiLK™, and Nanoglass™. The metal surfaces are preferably metal interconnects, most preferably made of copper.

Figure 1F:
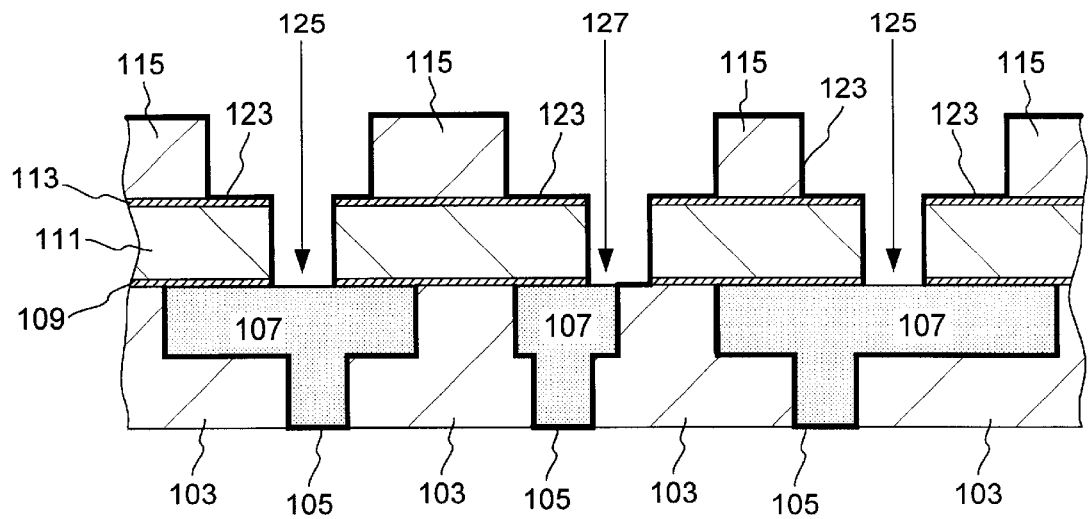

Depicted in FIG. 1F, in accordance with the invention, the wafer substrate (as depicted in FIG. 1E) is heated and exposed to a metal vapor. The metal vapor reacts with exposed surfaces of dielectric materials 115, 113, 111, and 109 to form a metal-derived diffusion barrier 123. The metal vapor does not react with copper 107, thus there is no diffusion barrier on these exposed surfaces (indicated by 125 and 127). Since the conditions are chosen (for example the wafer is heated under vacuum) such that the evaporation rate of metal from the wafer substrate is equal to or greater than the deposition rate of the metal on the wafer, no net deposition of metal occurs. Diffusion barrier 123 is non-volatile under the reaction conditions and therefore stays on the wafer. Diffusion barrier 123 is integral to the dielectric surfaces because the dielectric surfaces reacted with the metal vapor to form barrier 123. Methods of the invention show excellent step coverage and the barrier is highly uniform in thickness.

Figure 1G:
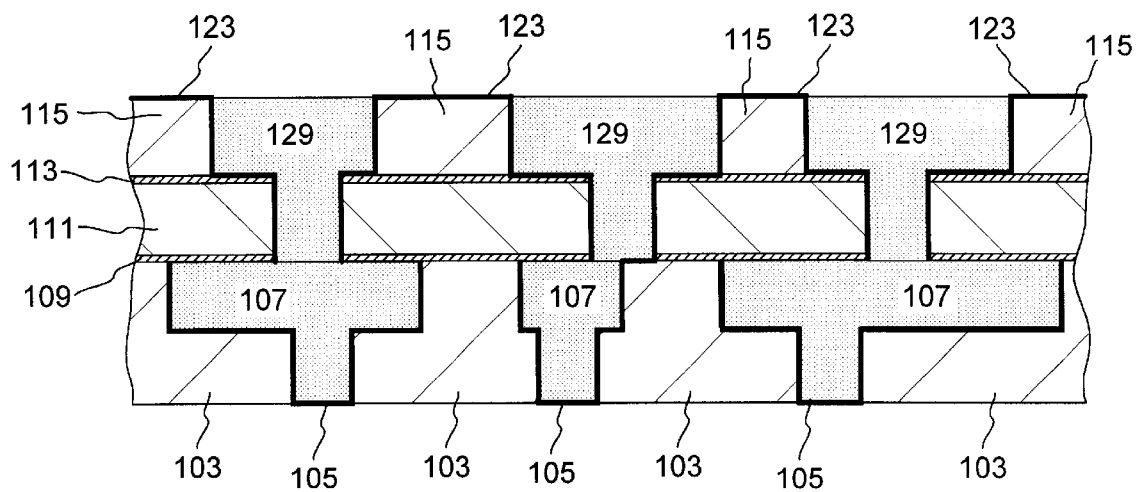

After diffusion barrier 123 is deposited, a seed layer of copper is applied (typically a PVD process) to enable subsequent electrolytic filling of the features with copper inlay. Of course, other methods such as CVD and electroless plating can be used to fill the features with copper. FIG. 1G shows the completed dual Damascene process, wherein copper conductive routes 129 are inlayed (seed layer not depicted) into the via and trench surfaces over barrier 123.

Figure 2A:
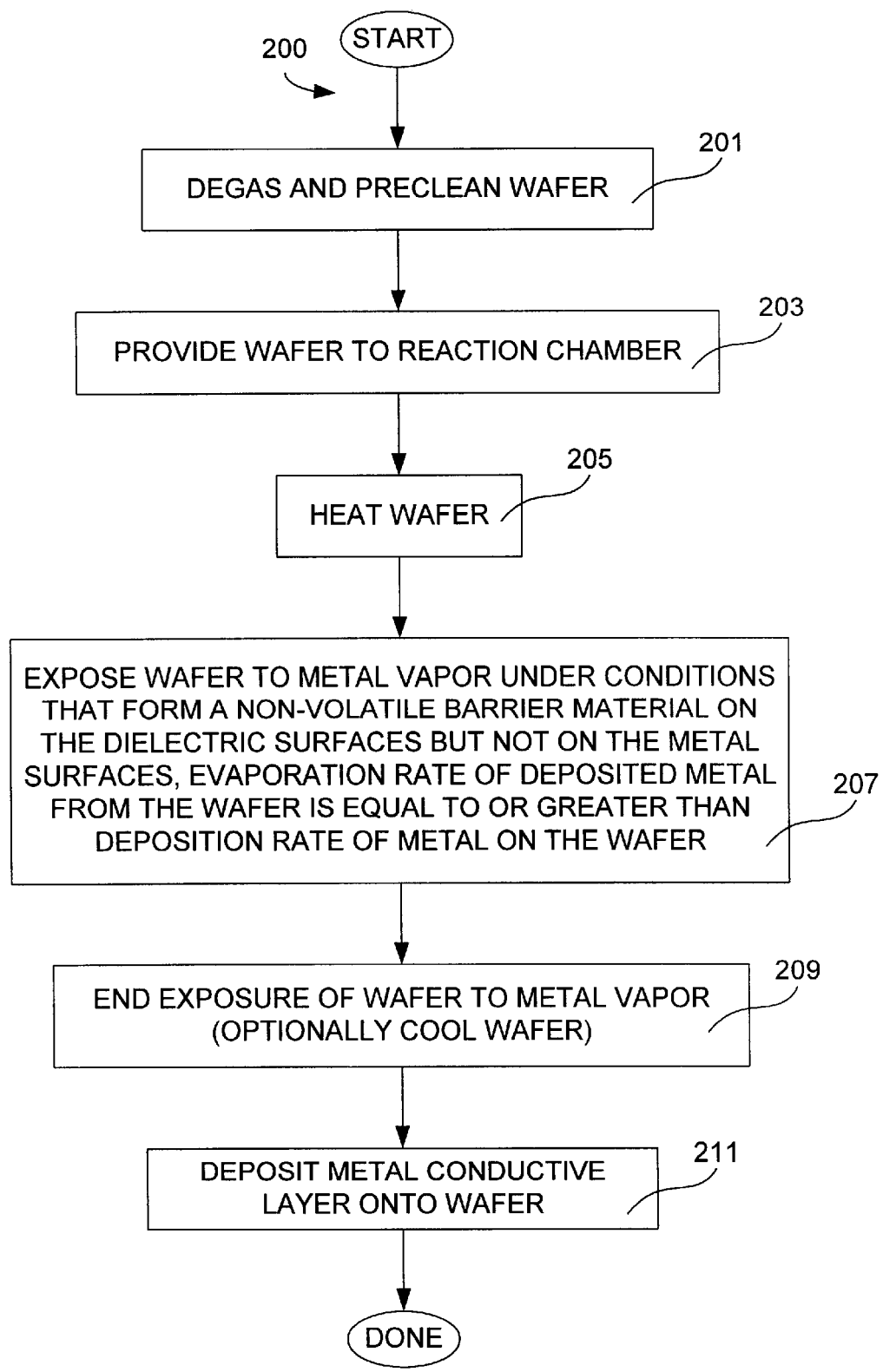
FIG. 2A presents aspects of a method for forming a diffusion barrier of the invention.

FIG. 2A presents aspects of a method, 200, for forming diffusion barriers of the invention. It should be understood that method 200 is an example, and that methods of the invention may include more or less processes than method 200. Preferably such methods will be carried out on a platform that allows transfer of a wafer into separate processing modules without breaking vacuum, or even more preferably, a tool that allows the entire process flow to be performed in a single processing chamber. One such tool is the INOVA Tool available from Novellus Systems of San Jose, Calif. Therefore, once a wafer is in the tool and a vacuum is established, all of the described process aspects can be performed without exposure to atmosphere. In at least in some embodiments, the entire method can be performed in the same processing chamber.

Referring to method 200 in FIG. 2A, a wafer is degassed and precleaned. See 201. If the diffusion barrier is to be formed in a separate chamber, then the wafer is provided to that reaction chamber. See 203. The wafer is heated. See 205. Preferably the wafer is heated to between about 200 and 1000° C. The wafer is heated for at least two reasons. First, the magnitude of the temperature is important for ensuring that any deposited metal on the wafer evaporates faster than the metal vapor deposits on the wafer. Second, a subsequently applied metal vapor will more readily react with the dielectric regions to form the diffusion barrier, when the wafer is heated.

Next, the wafer is exposed to metal vapor under reaction conditions that form a non-volatile barrier material on the dielectric surfaces but not on the metal surfaces. See 207. Important parameters for these conditions are the wafer temperature and the flux of the metal vapor (i.e. how much metal vapor per unit area the wafer is exposed to over time). The reactivity of the dielectric surfaces with the metal vapor will be a function of these parameters, and will also vary as a function of the materials used. Preferably the metal vapor includes at least one of magnesium, aluminum, zinc, cadmium, calcium, tin and strontium. Depending on the metal used, the temperature and the metal flux are adjusted to meet the desired evaporation and deposition criteria as outlined above. In a particularly preferred embodiment, magnesium is the metal. In this case, the wafer temperature is preferably between about 200 and 500° C., more preferably about 400° C.

Once the dielectric surfaces have reacted with the metal vapor to form the diffusion barrier, exposure of the wafer to the metal vapor is ceased. See 209. Preferably the non-volatile barrier material formed is between about 10 and 200 Å thick. Optionally, the wafer is cooled before the next process, but not necessarily. Finally, metal for subsequent conductive layers is deposited on the wafer. See 211. The metal deposition can be a seed layer for aiding subsequent electrolytic, electroless, or other metal deposition processes, depending on the application. Once the metal is deposited, the method 200 is done.

Figure 2B:
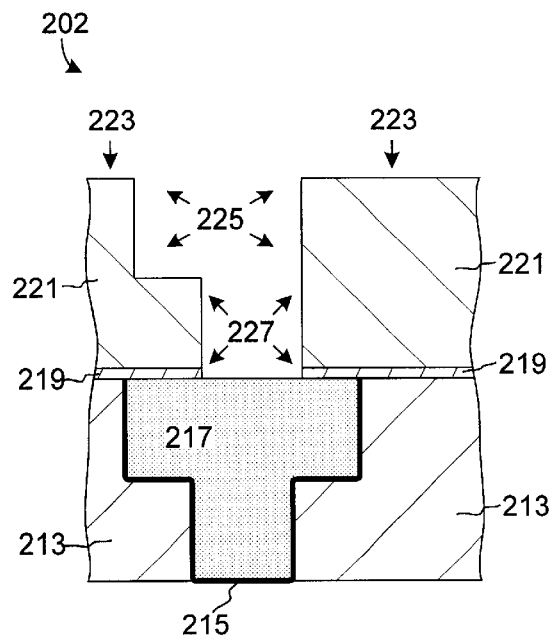
FIGS. 2B–D are cross-sectional (cut-out) depictions that illustrate various aspects of forming a diffusion barrier of the invention as described in FIG. 2A.
Figure 2C:
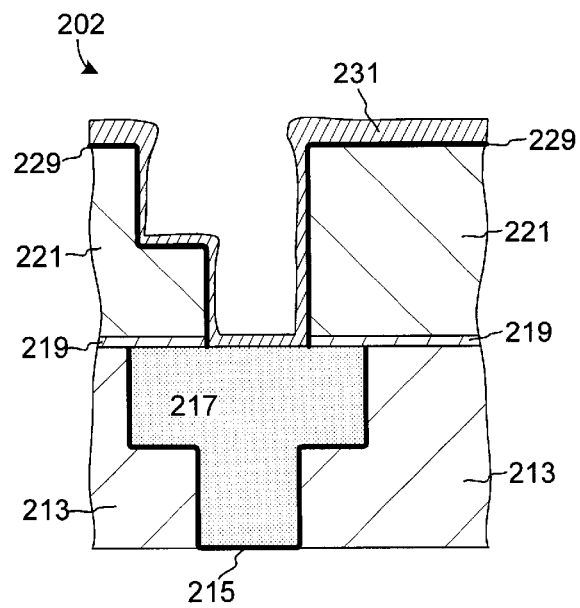
Figure 2D:
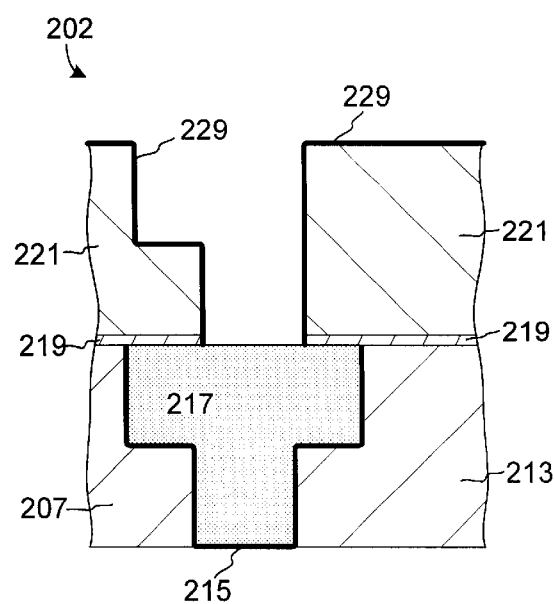

FIGS. 2B–D are cross-sectional (cut-out) depictions that illustrate various aspects of forming a diffusion barrier of the invention as described in FIG. 2A. Specifically, the figures describe aspects of a particularly preferred method in which a wafer having dielectric surfaces and copper surfaces is exposed to a magnesium vapor produced using planar magnetron sputtering. This method is somewhat like PVD in that a plasma source is used to produce the metal vapor (argon bombarding a magnesium target), but it is also somewhat like CVD in that a reaction takes place to form a barrier material. However in this invention, unlike CVD, one of the reactants is actually the surface of the wafer, more specifically the dielectric material surfaces. The method is also distinguished from MBE (molecular beam epitaxy) where layers of material are built up by taking advantage of high sticking coefficients. In the present invention, low sticking coefficients are desired so that the metal vapor does not build up on the wafer, but rather, only that portion of the metal vapor that reacts with the dielectric (to form a non-volatile barrier) actually stays on the wafer.

Referring to FIG. 2B, a typical substrate, 202, is illustrated. Substrate 202 includes a pre-formed dielectric layer 213 (such as silicon dioxide) with etched line paths (trenches and vias) in which; a diffusion barrier 215 has been deposited followed by inlaying with copper conductive route 217. A silicon nitride barrier layer 219 was laid thereon, followed by another layer of dielectric material, 221. After process steps (including lithography) for example as outlined in the background section above, dielectric layer 221 has etched trench 225, via 227, and field 223 which all have exposed dielectric material. At the bottom of via 227, copper conductive route 217 is exposed. Typically the dielectric material contains oxygen or some other element (as part of its molecular structure) that will react with magnesium vapor to form the diffusion barrier. For example, magnesium readily reduces silicon dioxide to form magnesium oxide and silicon. While not wishing to be bound to theory, it is believed that the barrier material will include at least one of magnesium oxide, magnesium silicon oxide, or in the case of the small portion of exposed sidewall 219 near the bottom of the via, magnesium nitride or magnesium silicon nitride.

For comparison purposes, FIG. 2C depicts substrate 202 after exposure to magnesium vapor as described above, but where the rate of evaporation of the magnesium is much less than the rate of deposition of magnesium (e.g. where the temperature of substrate 202 is 20° C.). In this case, a magnesium oxide barrier layer 229 is formed on dielectric 221. However, a magnesium metal layer 231 is deposited thereon. Like other PVD barrier layer deposition methods, the magnesium exhibits poor step coverage that could result in pinching-off near the top of sub-micron features before copper fill can be completed. In addition, magnesium covers the previously exposed surface of copper layer 217 at the bottom of the via leading to large increase in the electrical resistance.

However, FIG. 2D shows substrate 202 after exposure to specific deposition conditions, in accordance with the invention, where the rate of evaporation of magnesium is greater than the deposition rate of magnesium on the wafer. In this exemplary case, magnesium oxide-based layer 229 is formed selectively on the dielectric surfaces as a result of chemical reaction, and such a layer is highly uniform. Notably, there is no magnesium build-up on metal-derived diffusion barrier 229 thereby avoiding problems associated with pinch-off with traditional processing methods. In addition, there is no magnesium deposited on the exposed surface of the underlying copper interconnect 217. Thus, subsequently deposited copper will fully contact copper interconnect 217 at the bottom of via 227 resulting in negligible impact in the electrical resistance between the copper layers.

In the invention, various dielectrics are exposed to metal vapors, the idea is to match the reactivity of the metal with the dielectric so an effective diffusion barrier (or other structure) is formed. For example, aluminum or zirconium vapor may react with silicon dioxide to form their corresponding oxides. These metal-derived layers can be effective gate dielectrics. It is also important that the metal-derived layer is not formed on metal contacts. In some cases, the metal vapor may combine with or diffuse into the metal contacts but this may be acceptable when no barrier is formed on the metal contact and the electrical or other desired properties of the metal contact are not compromised.

Figure 3A:
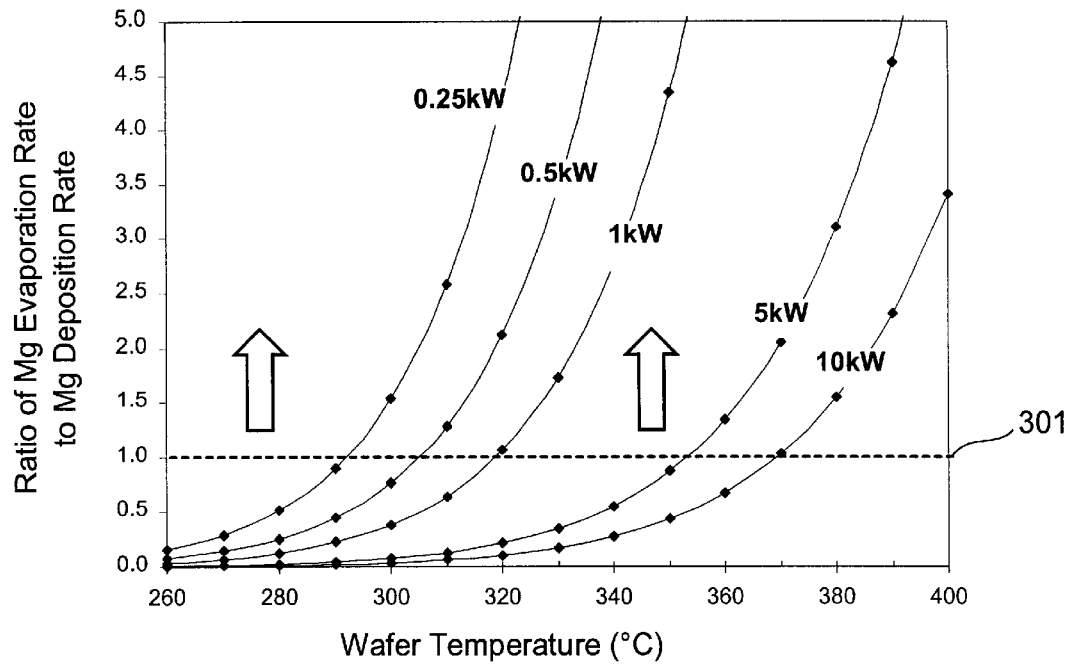
FIG. 3A is a graph showing the relationship between the ratio of magnesium evaporation rate to magnesium deposition rate and wafer temperature for various magnetron power levels.

To achieve the results as depicted in FIGS. 2D, preferably the ratio of evaporation of magnesium to deposition of magnesium should be greater than unity. FIG. 3A is a graph showing the calculated ratio of magnesium evaporation to magnesium deposition as a function of wafer temperature at various applied power levels for the magnetron sputter. For these calculations the deposition rate (Å/sec), based on planar magnetron sputtering of pure magnesium in the INOVA tool, is described by the equation:

$$D = 35 \times P(kW)$$

Where D is the deposition rate of magnesium and P is the power applied to the sputter target. The evaporation rate (Å/sec) of magnesium is described by the equation:

$$E = 3.4 \times 10^6 \times (24/T)^{1/2} \times 10^{(8.64-7650/T(K))}$$

Where E is the evaporation rate of magnesium, and T is the wafer temperature. As indicated by dotted line 301, when the ratio of E/D is greater than one (as indicated by the bold arrows), there is no net deposition of magnesium on the wafer.

Figure 3B:
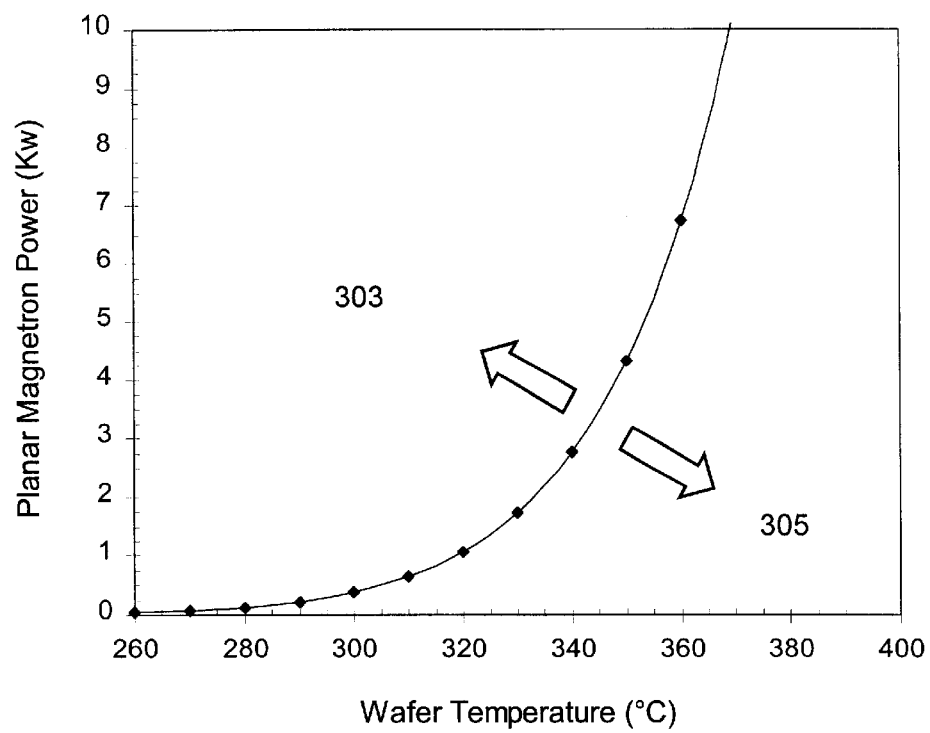
FIG. 3B is a graph showing the relationship between applied magnetron power levels and wafer temperature, illustrating regimes of net magnesium deposition and no magnesium deposition.

FIG. 3B shows a graph of magnetron power versus wafer temperature. From this plot there are two regions delineated. Under conditions encompassed by region 303 there will be net deposition of magnesium on the wafer. Under conditions encompassed by region 305, there will be no deposition of magnesium on the wafer. Thus, one can choose a suitable combination of magnetron power and wafer temperature to prevent deposition of magnesium.

The flux of magnesium can be controlled by the magnetron power, the strength of the magnetic field of the source, the pressure of argon used to form the plasma, and the proximity of the wafer to the target source (the further away, the lower the flux). For instance, the power to the target could vary from 1 to 20 kW, the wafer could be between 200 to 500° C., and argon pressure could be in the range of 1 to 25 millitorr.

Figure 4A:
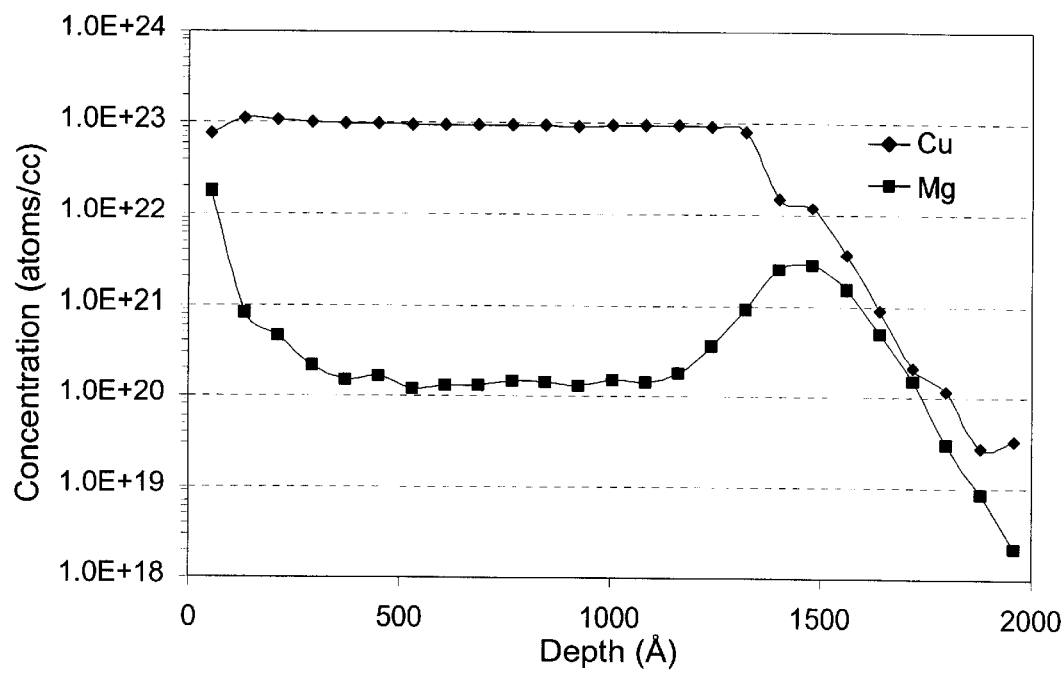
FIG. 4A is a graph showing the magnesium distribution after deposition on a separate heated wafers containing either dielectric or copper surfaces exposed to magnesium vapor.

FIG. 4A is a graph of showing the magnesium distribution obtained from Secondary Ion Mass Spectroscopy (SIMS) after deposition (power to the target was 250W, deposition time was 100 seconds) on separate heated wafers (275° C.). In one case the substrate was thermally grown silicon dioxide on silicon and in the other case, the substrate was a copper substrate. This plot reveals that only a small amount (<0.3 atomic %) of magnesium is introduced into the copper. This amount of magnesium is insufficient to adversely affect the conductive properties of the copper. It has been shown in the literature, as well as in our own work, that the increase in resistivity of copper with small additions of magnesium is ≈0.8 $\mu\Omega$-cm per atomic % of magnesium.

Figure 4B:
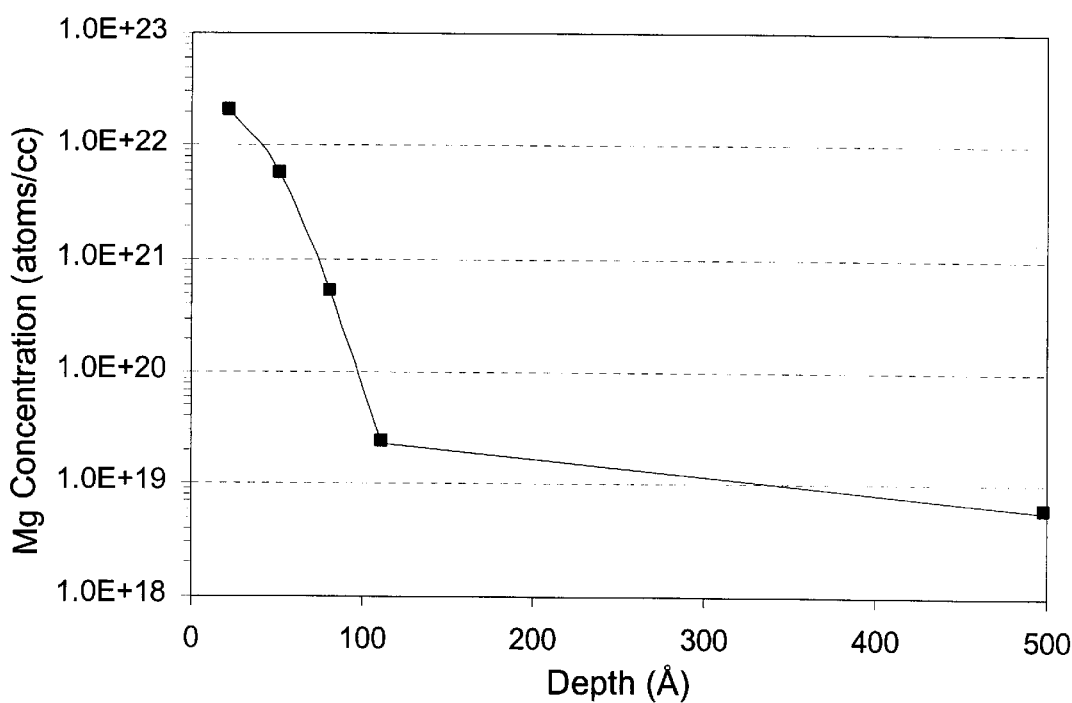
FIG. 4B is a graph of SIMS analysis data.

FIG. 4B is a graph of SIMS analysis data showing the magnesium distribution after deposition on a heated wafer having a silicon dioxide (dielectric) surface film. The graph shows that a wafer temperature of 275° C. gives near-zero thickness of magnesium on the magnesium oxide barrier formed, and no net deposition of magnesium under deposition conditions that would deposit 1000 Å of magnesium at room temperature.

Figure 5:
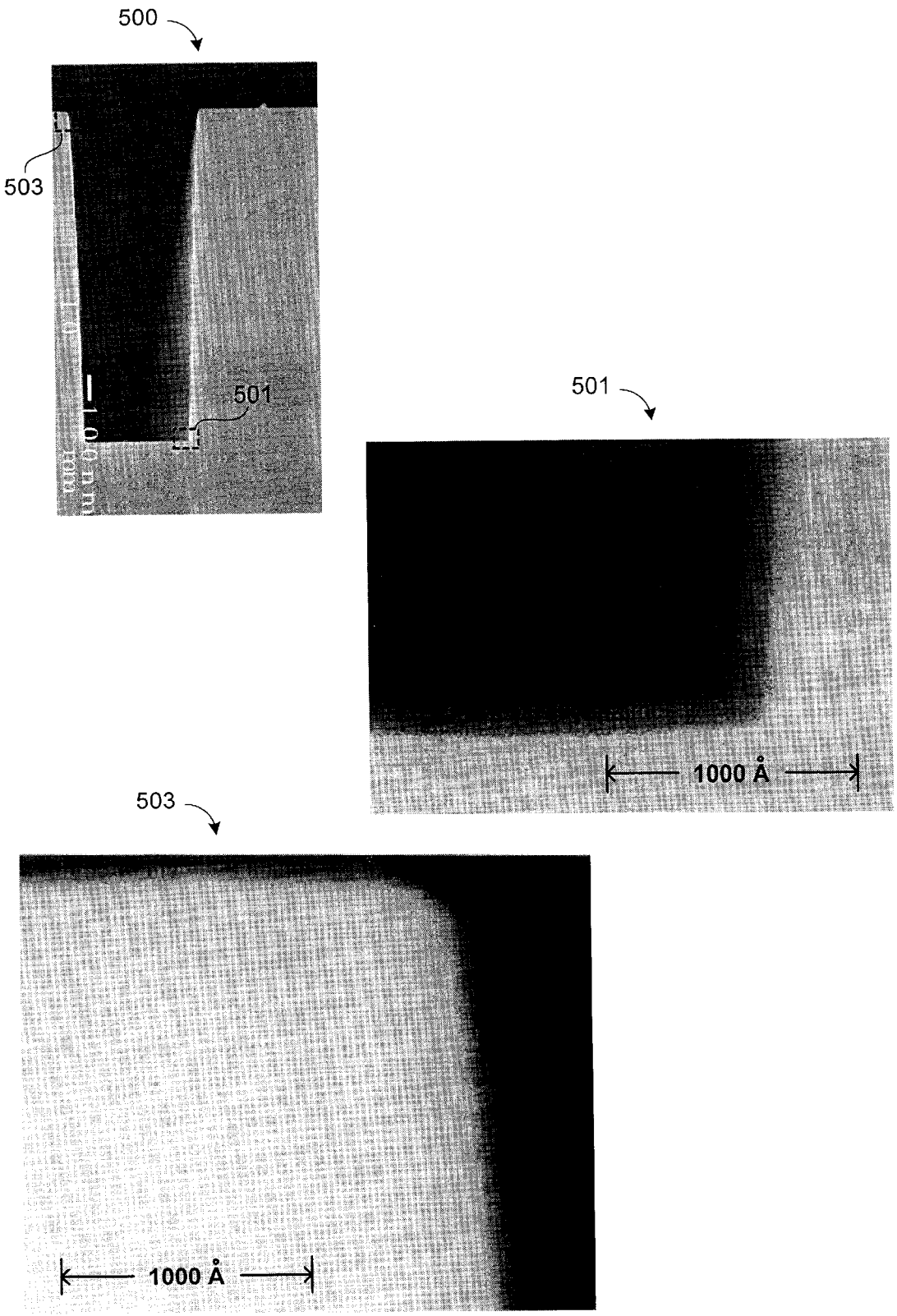
FIG. 5 shows cross-sectional images from electron microscopy of a 0.3 μm trench revealing the formation of a thin conformal magnesium-based diffusion barrier.

FIG. 5 contains a cross-sectional Secondary Electron Microscopy image showing a 0.3 $\mu$m trench in a substrate of dielectric material after the substrate was heated to 400° C. and exposed to magnesium vapor for ten minutes. It is evident that there is no build-up of magnesium within the feature. Since, there are no metal regions in this substrate, the barrier film is continuous over the entire surface of the dielectric material. Also depicted in FIG. 5 are magnified images of the particular regions 501 (corner at bottom of trench) and 503 (corner at top of trench opening). Both magnified images reveal the formation of a thin continuous metal-derived layer. A magnesium based film can clearly be seen at the surface of the dielectric. In this case, such a layer would be $MgSi_xO_y$ where x and y refer to the concentration of silicon and oxygen in the metal-derived film.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a metal-derived layer on at least a portion of a substrate, the method comprising:

heating the substrate; and exposing the substrate to a metal vapor under a set of conditions in which the metal vapor reacts with at least a dielectric portion of the surface of the substrate to form the metal-derived layer of about 10 Å to 200 Å thick thereon, said metal-derived layer being non-volatile under the set of conditions and comprising a reaction product of said metal vapor and said dielectric;

wherein the set of conditions includes a flux of metal and a substrate temperature such that the evaporation rate of deposited metal from the wafer substrate is equal to or greater than the deposition rate of the metal vapor on the wafer substrate.

2. The method of claim 1, wherein a metal used to form the metal vapor comprises at least one of magnesium, aluminum, zinc, cadmium, calcium, tin, and strontium.

3. The method of claim 1, wherein the substrate is a partially fabricated integrated circuit and the metal-derived layer comprises at least one of a metal-oxide, a metal-carbide, a metal-nitride, a metal-silicide, metal halide, and combinations thereof.

4. The method of claim 1, wherein the substrate temperature is between about 50 and 1000° C.

5. The method of claim 1, wherein the metal vapor is formed by a physical vapor deposition technique.

6. The method of claim 5, wherein the physical vaporization technique comprises at least one of sputtering, evaporation, ion beam deposition, and molecular beam deposition.

7. The method of claim 6, further comprising forming the metal vapor in an energized plasma by planar magnetron sputtering.

8. The method of claim 1, wherein the metal vapor is magnesium vapor.

9. The method of claim 1, wherein the metal vapor reacts with oxygen-containing species in the substrate to produce a metal oxide.

10. The method of claim 9, wherein the metal oxide is magnesium oxide.

11. The method of claim 9, wherein the substrate includes a plurality of metal contacts, and wherein the metal oxide is not formed on the metal contacts.

12. A method for selectively forming a diffusion barrier on a wafer substrate having a plurality of dielectric surfaces and a plurality of metal interconnect surfaces, the method comprising:

heating the wafer substrate; and exposing the wafer substrate to a metal vapor under a set of conditions in which the metal vapor reacts with the plurality of dielectric surfaces to form a non-volatile barrier material comprising a reaction product of said metal vapor and said dielectric thereon, and said metal vapor does not react with the plurality of metal interconnect surfaces;

wherein the set of conditions includes a flux of metal and a substrate temperature such that the evaporation rate of deposited metal from the substrate is equal to or greater than the deposition rate of the metal vapor on the wafer substrate.

13. The method of claim 12, wherein the plurality of metal interconnects are copper interconnects.

14. The method of claim 12, wherein the metal vapor comprises at least one of magnesium, aluminum, zinc, cadmium, calcium, tin, and strontium.

15. The method of claim 12, wherein the wafer substrate temperature is between about 50 and 1000° C.

16. The method of claim 12, wherein the plurality of dielectric surfaces comprise at least one of silicon dioxide, silicon oxynitride, silicon nitride, fluorinated silica glass, CORAL™, Black Diamond™, SiLK™, and Nanoglass™.

17. The method of claim 12, wherein the non-volatile barrier material is between about 10 and 200 Å thick.

18. The method of claim 12, wherein the metal vapor is formed by a physical vapor deposition technique.

19. The method of claim 12, wherein the physical vaporization technique comprises at least one of sputtering, evaporation, ion beam deposition, and molecular beam deposition.

20. The method of claim 12, further comprising forming the metal vapor in an energized plasma by planar magnetron sputtering.

21. A method for selectively forming a diffusion barrier on a wafer substrate having a plurality of dielectric surfaces and a plurality of metal interconnect surfaces, the method comprising:

heating the wafer substrate; and exposing the wafer substrate to a metal vapor under a set of conditions in which the metal vapor reacts with the plurality of dielectric surfaces to form a non-volatile barrier material comprising a reaction product of said metal vapor and said dielectric thereon, and said metal vapor does not react with the plurality of metal interconnect surfaces;

wherein the set of conditions includes a flux of metal and a substrate temperature such that the evaporation rate of deposited metal from the substrate is equal to or greater than the deposition rate of the metal vapor on the wafer substrate, and wherein the metal vapor is a magnesium vapor.

22. The method of claim 21, wherein the wafer substrate temperature is between about 200 and 500° C.

23. The method of claim 21, wherein the wafer substrate temperature is about 400° C.

24. The method of claim 21, wherein the non-volatile barrier material comprises at least one of magnesium oxide and magnesium silicon oxide.

25. The method of claim 21, wherein the non-volatile barrier material is between about 10 and 100 Å thick.

* * * * *